United States Patent [19]

Miyoshi et al.

[11] Patent Number: 5,812,892
[45] Date of Patent: Sep. 22, 1998

[54] MULTI-BEAM IMAGE FORMING SYSTEM

[75] Inventors: Hisaji Miyoshi; Toshifumi Kimba; Tamihiro Miyoshi, all of Tokyo, Japan

[73] Assignee: Asahi Kogaku Kogyo Kabushiki Kaisha, Tokyo, Japan

[21] Appl. No.: 859,701

[22] Filed: May 21, 1997

[30] Foreign Application Priority Data

May 23, 1996 [JP] Japan ................................. 8-151699

[51] Int. Cl.$^6$ ............................ G03B 41/00; B41J 2/447
[52] U.S. Cl. ...................... 396/548; 347/236; 347/241; 359/641
[58] Field of Search ........................... 396/548; 347/133, 347/236, 240, 241, 243, 244, 251; 359/641

[56] References Cited

U.S. PATENT DOCUMENTS

| | | |
|---|---|---|
| 3,984,845 | 10/1976 | Tashiro et al. .......................... 396/548 |
| 4,003,061 | 1/1977 | LaCanfora ............................... 396/548 |
| 4,074,320 | 2/1978 | Kapes ....................................... 358/482 |
| 4,416,522 | 11/1983 | Webster ................................... 396/548 |
| 5,664,251 | 9/1997 | Tachihara et al. ...................... 396/548 |
| 5,745,296 | 4/1998 | Nakamura et al. ..................... 359/641 |

*Primary Examiner*—A. A. Mathews
*Attorney, Agent, or Firm*—Greenblum & Bernstein P.L.C.

[57] ABSTRACT

Disclosed is a multi-beam image forming system, which has a light emitting unit including a plurality of light sources emitting a plurality of beams, and a table carrying a photosensitive film on which an image is formed with the plurality of beams. A sensor is provided on the table, and light amount of each of the light sources is detected by moving the table and the light source relative to each other. Further, based on the detected light amount of each of the light sources, compensation values are determined. The compensation values are used when the light sources are driven so that the light amount on the photosensitive film accurately corresponds to an image data.

17 Claims, 10 Drawing Sheets

2048

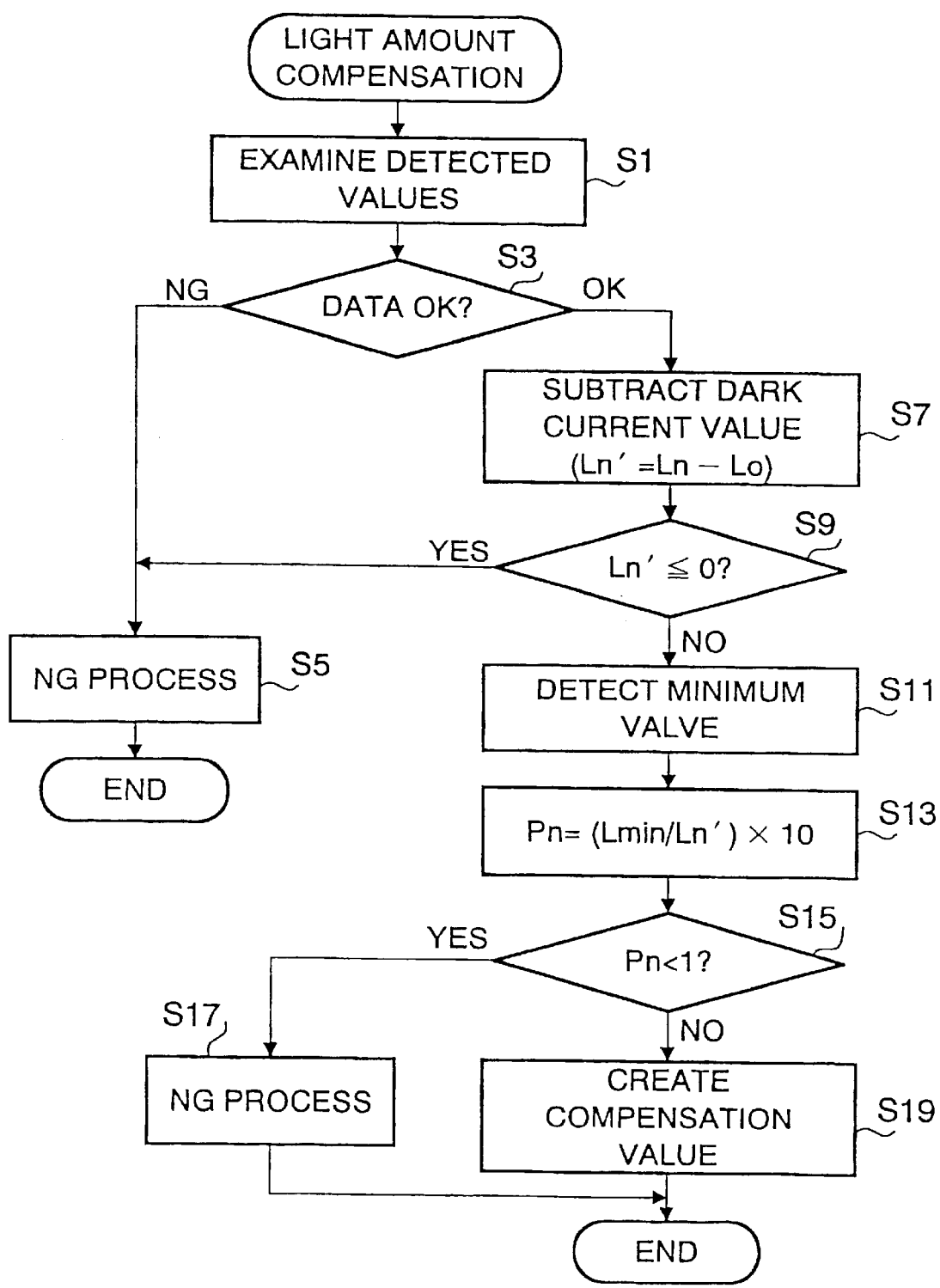

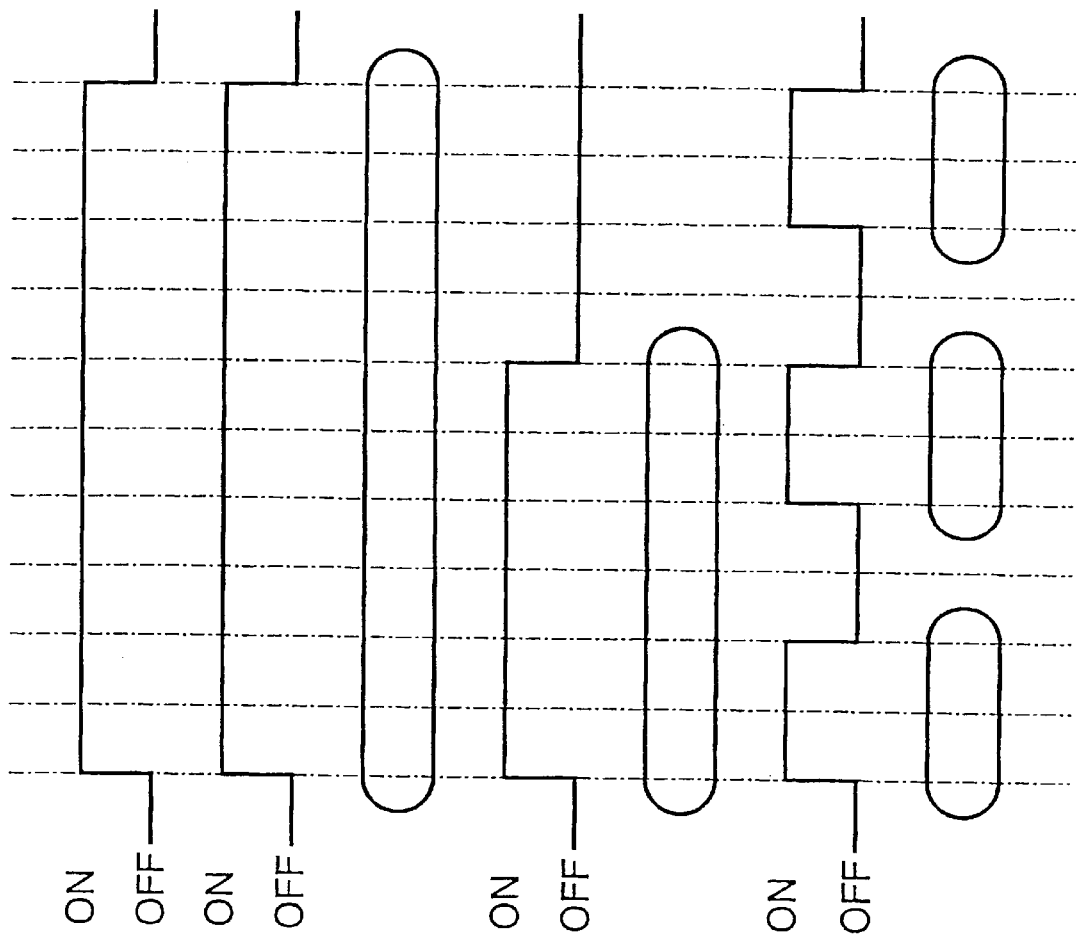

MULTI-BEAM IMAGE FORMING SYSTEM

BACKGROUND OF THE INVENTION

The present invention relates to a multi-beam image forming system, such as an apparatus for drawing a circuit pattern on a mask for a printed circuit board.

Conventionally, as an imaging apparatus which forms accurate patterns (for example, patterns of printed substrate circuits), a multi-beam drawing apparatus is known. The multi-beam drawing apparatus includes, for example, a plurality of LED's (Light Emitting Diodes). Beams emitted by the plurality of LED's are converged on a photo-sensitive member by an optical system. By moving the plurality of LED's relative to the surface of the photo-sensitive member, a two-dimensional image is drawn on the photo-sensitive member. An example of such an apparatus is described in the U.S. patent application Ser. No. 08/648,705, now U.S. Pat. No. 5,664,251, teachings of which are incorporated herein by reference.

However, if the image forming apparatus uses a plurality of LED's, due to characteristic differences of each LED, the intensity of the light beam emitted by each LED may be different. Further, due to the characteristics of the optical system and/or a structure of the apparatus, even if all the LED's emit the beams of the same amount of light, the light amount on the photosensitive member may have an uneven brightness distribution. Furthermore, if the LED's are deteriorated, a similar situation may occur.

In order to obtain an accurate image on a surface where the image is formed, the light amount of the beam emitted from each LED must be accurately compensated, i.e., a compensation amount should be determined for each LED, and each LED is accurately driven by with taking the compensation amount into account.

In recent multi-beam drawing apparatus, a large number of LED's are used. To determine the compensation amount for each of the LED's is very troublesome, and desired is a device for measuring the light amount and determining the compensation amount accurately and easily.

SUMMARY OF THE INVENTION

It is therefore an object of the present invention to provide an improved multi-beam image forming apparatus capable of accurately measuring a light amount emitted from each one of a plurality of LED's, and compensating the light amount of each LED.

For the object, according to the invention, there is provided a multi-beam image forming system for forming an image on a photosensitive material in accordance with an image data, comprising: a plurality of light sources, which respectively emit a plurality of beams; a table, a photosensitive material on which an image is formed with the plurality of beams; a light source driver which drives the plurality of light sources separately; a light source moving mechanism which moves the light source relative to the table at least in a first direction, the first direction being parallel to a surface of the table on which the photosensitive material is placed; a table moving mechanism which moves the table relative to the light source in at least a second direction which is different from the first direction, the second direction being parallel to the surface of the table on which the photosensitive material is placed; a light sensor provided to the table, the light sensor receiving light and outputting a signal corresponding to the received amount of light; a memory; a controller, which controls the light source driver, the light source moving mechanism and the table moving mechanism such that all of the plurality of light beams are incident to the light sensor at different timings, the signal output by the light sensor for each of the plurality of light sources being stored in the memory.

Optionally, the plurality of beams are incident within a predetermined area on the photosensitive material, wherein light receiving area of the light sensor is smaller than the predetermined area, wherein the predetermined area is divided into a plurality of segments, each of which can be included in the light receiving area, and wherein the controller controls the table moving mechanism and the light source moving mechanism so that one of the plurality of segments is included in the light receiving surface, and then controls the light source driver to drive the plurality of light sources such that the light sources corresponding to the segment included in the light receiving surface is driven to emit a beam one by one.

Further optionally, the controller does not drive the light source moving mechanism and the table moving mechanism when the light sources corresponding to a segment included in the light receiving area are driven.

Further, the controller drives the light source moving mechanism and the table moving mechanism when all the light sources corresponding to the segment included in the light receiving area of the light sensor have been driven such that another one of the plurality of segments is included in the light receiving area of the light sensor.

Still optionally, wherein the plurality of light sources comprise a plurality of light emitting diodes.

Further, the plurality of light sources comprise an aperture plate formed with a plurality of apertures which correspond to the plurality of laser diodes, the aperture plate being provided close to the plurality of laser diode and between the plurality of laser diodes and the table, and wherein the image forming system further comprises an converging optical system provided between the aperture plate and the table, the aperture plate and the photosensitive material are positioned at optical conjugate positions with respect to the converging optical system.

Yet optionally, the signal stored in the memory represents a gradation data consisting of a plurality of bits.

Further, the multi-beam image forming system may include an evaluation system which evaluates the data stored in the memory.

In this case, the evaluation system evaluates the data after an effect of dark current is removed from the data.

Furthermore, the evaluation system evaluates that an image forming system is out of use if one of the plurality of gradation data indicates light is not incident.

Optionally, the evaluation system evaluates that an image forming system is out of use if one of the plurality of gradation data has its highest value.

Further, the system is provided with a device which calculates a compensation data based on the gradation data, the compensation data being used by the light source driver when the plurality of light sources are driven so that light amount received by the photosensitive material is substantially even.

In this case, the device obtains a minimum value from the gradation data, and determines a period of time during which each of the plurality of light sources is to be driven based on the minimum value and the gradation data corresponding to each light source.

Alternatively, the device obtains a maximum value from the gradation data, and determines a period of time during which each of the plurality of light sources is to be driven, based on the maximum value and the gradation data corresponding to each light source.

Furthermore, the multi-beam image forming system may have another memory for storing a plurality of patterns according to which the plurality of light sources are driven, one of the plurality of patterns being selected based on the compensation data.

According to another aspect of the invention, there is provided an image forming system including a multi-beam image forming apparatus for forming image on a photosensitive material in accordance with an image data, and a control station connected to the multi-beam image forming apparatus, the image forming apparatus comprising:
a plurality of light sources, which respectively emit a plurality of beams;
a table, the photosensitive material on which an image is formed with the plurality of beams;
a light source driver which separately drives the plurality of light sources;
a light source moving mechanism which moves the light source relative to the table at least in a first direction, the first direction being parallel to a surface of the table on which the photosensitive material is placed;
a table moving mechanism which moves the table relative to the light source in at least a second direction which is different from the first direction, the second direction being parallel to the surface of the table on which the photosensitive material is placed;
a light sensor provided to the table, the light sensor receives light and outputs a signal corresponding to the received amount of light;
a memory;
a controller, which controls the light source driver, the light source moving mechanism and the table moving mechanism such that all of the plurality of light beams are incident on the light sensor at different timings, the signal output by the light sensor for each of the plurality of light sources being stored in the memory, the control station comprising:
a data evaluating system which evaluates the data stored in the memory to determine whether the data stored in the memory is valid.

Optionally, the control station may be further provided with a device which calculates compensation data for respective light sources based on the data stored in the memory of the multi-beam image forming apparatus.

BRIEF DESCRIPTION OF THE DRAWINGS

FIG. 11 is a flowchart illustrating a light amount compensation process according to a first embodiment;

FIGS. 13A through 13G show relationship between a diving pulse, driving pattern, and loci of image formed on a film.

DETAILED DESCRIPTION OF THE PREFERRED EMBODIMENTS

Figure 1:
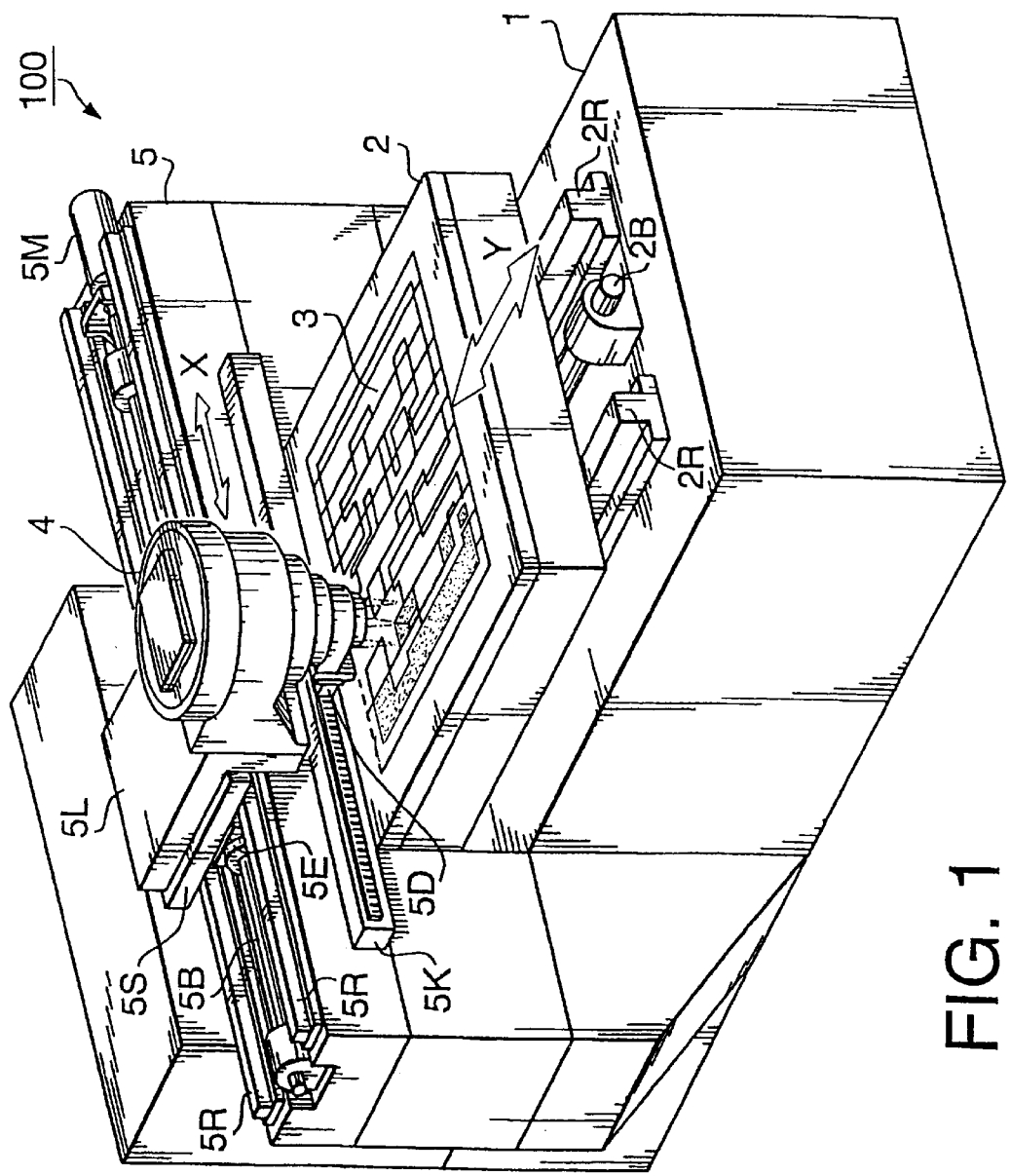
FIG. 1 is a perspective view of a multi-beam image forming apparatus embodying the present invention.

FIG. 1 is a perspective view of a multi-beam image forming apparatus 100 embodying the present invention. The image forming apparatus 100 is used for drawing a circuit pattern on a mask, and the mask is used to expose the pattern onto a photosensitive material on a substrate to create a printed circuit board. Alternatively, the apparatus 100 may be used for drawing the circuit pattern directly on the photosensitive material on a substrate.

In the following description, the structure of the image forming apparatus 100 is described under a situation where circuit pattern is drawn on a photosensitive film which is to be used for the mask.

The image forming apparatus 100 comprises a base 1 supporting a movable table 2. A photosensitive film 3, on which a mask pattern is to be drawn (formed), is carried on the table 2. The table 2 is slidably supported by a pair of guide rails 2R, 2R extending in a Y direction (shown by an arrow Y). Below the table 2, or on a upper surface of the base 2, a ball screw 2B is provided. The ball screw 2B extends in the Y direction. On a lower surface of the table 2, an engaging protrusion (not shown) is formed to engage with the ball screw 2B. When the ball screw 2B is rotated by a table drive motor (not shown), the table is moved along the Y direction due to the engagement of the ball screw 2B with the engaging protrusion.

A light emitting unit 4 is provided above the table 2 to emit light beams in a two dimensional pattern.

The light emitting unit 4 is mounted on an optical base portion 5 which is formed to have a substantially U-shaped body surrounding the base 1. Specifically, on an upper surface of the optical base portion 5, a pair of guide rails 5R and 5R extending in an X direction are provided. The guide rails 5R and 5R slidably support an optical system transport stage 5S. The optical system transport stage 5S carries an optical base plate 5L, and the light emitting unit 4 is fixed to the optical base plate 5L.

Further, on the upper surface of the optical base portion 5, a ball screw SB is provided between the pair of guide rails 5R and 5R, extending in the X direction. On a bottom surface of the optical system transport stage 5S, an engaging protrusion 5E is provided. The ball screw 5B is connected to an optical system driving motor 5M. When the optical system driving motor 5M is driven to rotate the ball screw 5B, due to the engagement of the engaging protrusion 5E with the ball screw 5B, the optical system transport stage 5S mounting the optical base 5L moves in the X direction.

The base 1 is provided with an X-direction linear scale 5K formed on a front surface of the base portion 5, extending along the X direction. The light emitting unit 4 has an X-direction scale detector head 5D that reads position information from the X-direction linear scale 5K to detect the position of the light emitting unit 4 in the X direction.

The optical system driving motor 5M is controlled by applying feedback from the X-direction scale detector head 5D. The base 1 is similarly provided with a Y-direction linear scale (not shown) that extends along the Y direction, while the table 2 has a Y-direction scale detector head (not shown), for similarly controlling the table drive motor (not shown).

Figure 7:
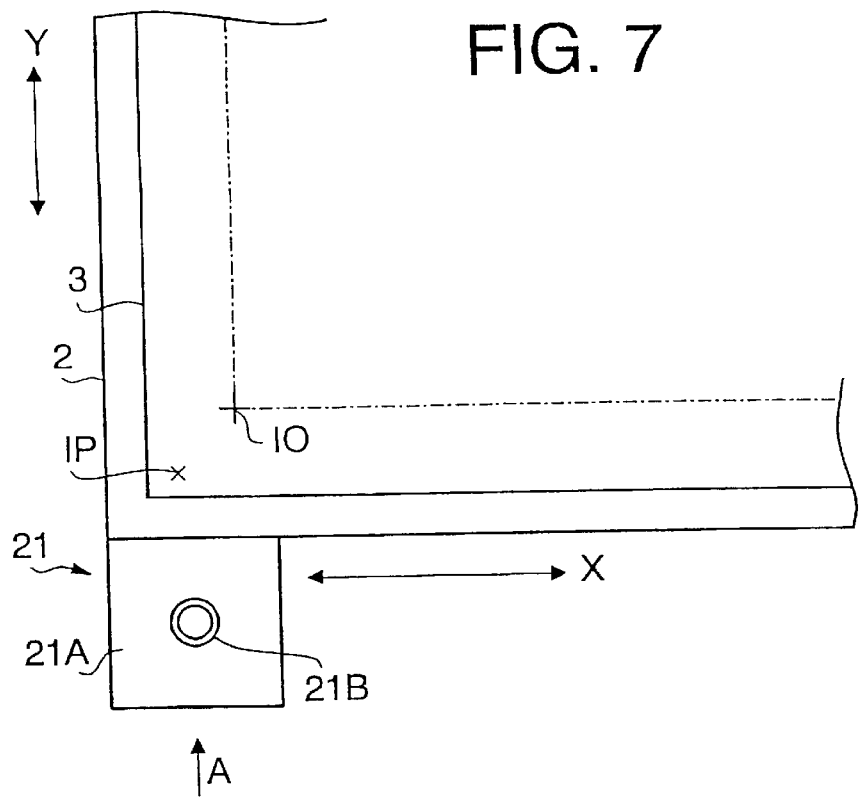
FIG. 7 shows a portion around a light amount detection unit on a table on which a photosensitive film is placed.

On the photosensitive film 3, an original point 10 is defined (see FIG. 7). Drawing of a pattern on the film 3 is executed such that moving amounts, with respect to the original point 10, of the light emitting unit 4 in the X direction, and the table 2 in the Y direction are controlled, and the beams are emitted from the light emitting unit 4.

Figure 2:
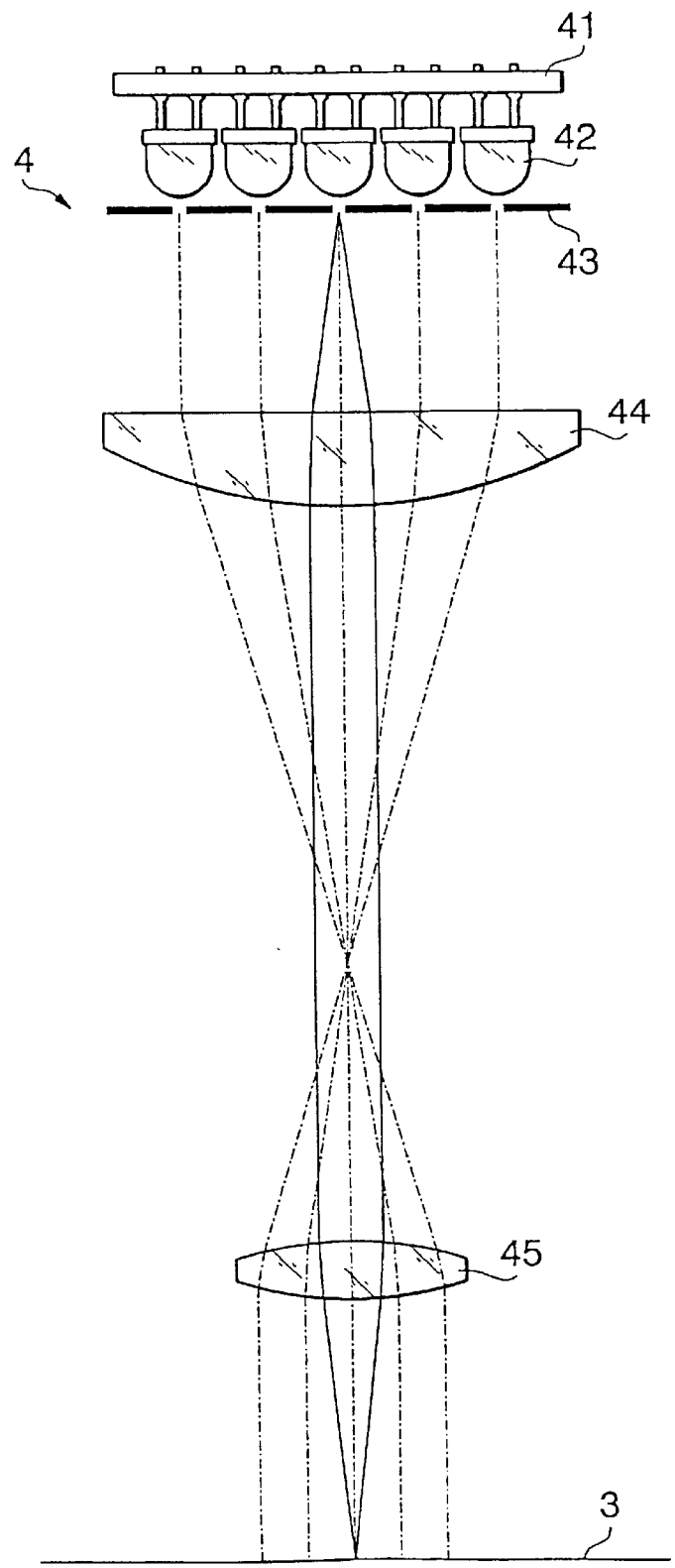
FIG. 2 is a schematic view of an optical system of the image forming apparatus of FIG. 1.

FIG. 2 shows the construction of the optical system of the light emitting unit 4. The light emitting unit 4 comprises a light emitting diode (LED) array that is formed of a multiplicity of LED's 42 attached to a printed circuit board 41, an aperture plate 43 having a multiplicity of apertures 43A, each corresponding to one of the LED's 42, and a reducing optical system, that comprises a first lens group 44 and a second lens group 45. The light emitted from the LED's 42 passes through the apertures 43A in the aperture plate 43, and is projected by the reducing optical system onto the photosensitive film 3. Thus the images of the apertures 43A are formed on the photosensitive film 3. The aperture plate 43 and photosensitive film 3 are arranged at optically conjugate positions with respect to the reducing optical system.

The photosensitive film 3 is, for example, an orthochromatic plate having a spectral sensitivity in the range of 400 nm to 570 nm wavelength. The LED's 42 are, for example, blue light emitting diodes having a peak wavelength of 450 nm.

Figure 4:
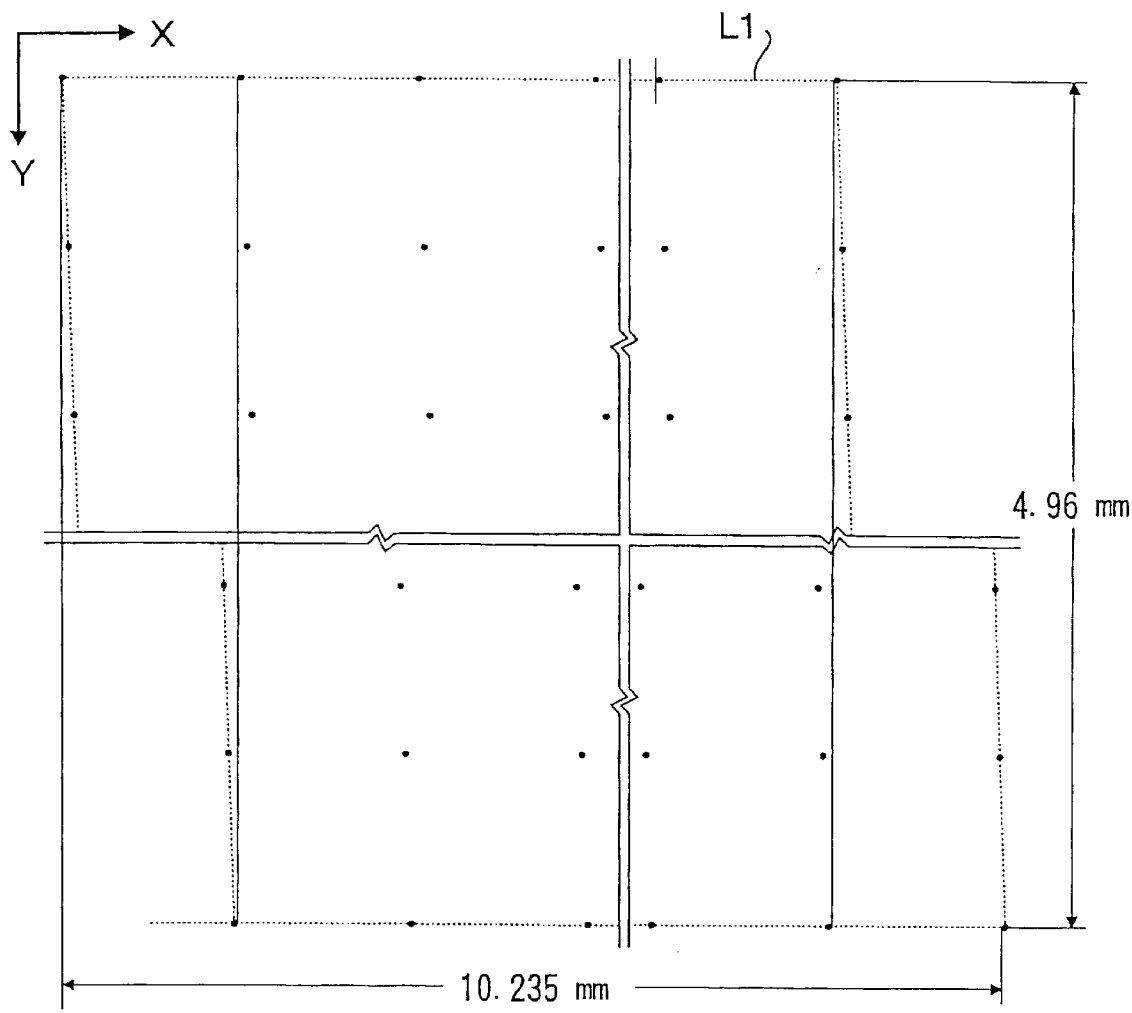
FIG. 4 shows a pattern of dot images formed on a photosensitive film by apertures in the aperture plate.

Positions of the image of the apertures formed on the photosensitive film 3 are shown in FIG. 4. It should be noted that FIG. 4 is intended to show an arrangement of the dot images, and the size of each image is not shown accurately in FIG. 4. In the embodiment, the size of the aperture formed on the film 3 is 1/25 of the size of the aperture 43A.

An apparatus for drawing a circuit pattern on a substrate must have accurate drawing characteristics and high resolution. In order to obtain a high resolution, both the diameter of the dot images and the pitch between dot images should be small. A problem exists in that when an LED array is used as the light source, the pitch of the light emitting points in a row and column is restricted by the actual size of each LED element. The LED used in the image forming apparatus 100 has a maximum diameter of 3.8 mm on a plane parallel to the film 3. In order to arrange the LED's such that they do not contact each other, the LED's are arranged at every 4 mm, in the X and Y directions, as shown in FIG. 3.

Specifically, the multiplicity of apertures 43A are formed in the aperture plate 43 in a staggered (slightly inclined) two dimensional array having a number of evenly spaced rows R in the Y direction, and a number of inclined columns C, each angled from the Y direction by the same amount and evenly spaced from each other. In this example, each of the LED's 42 is of, as described above, 3.8 mm diameter in the plane of the circuit board 41. Since the apertures 43A are formed at locations corresponding to those of the LED's 42, the dot images are formed discretely on the photosensitive film 3.

Figure 3:
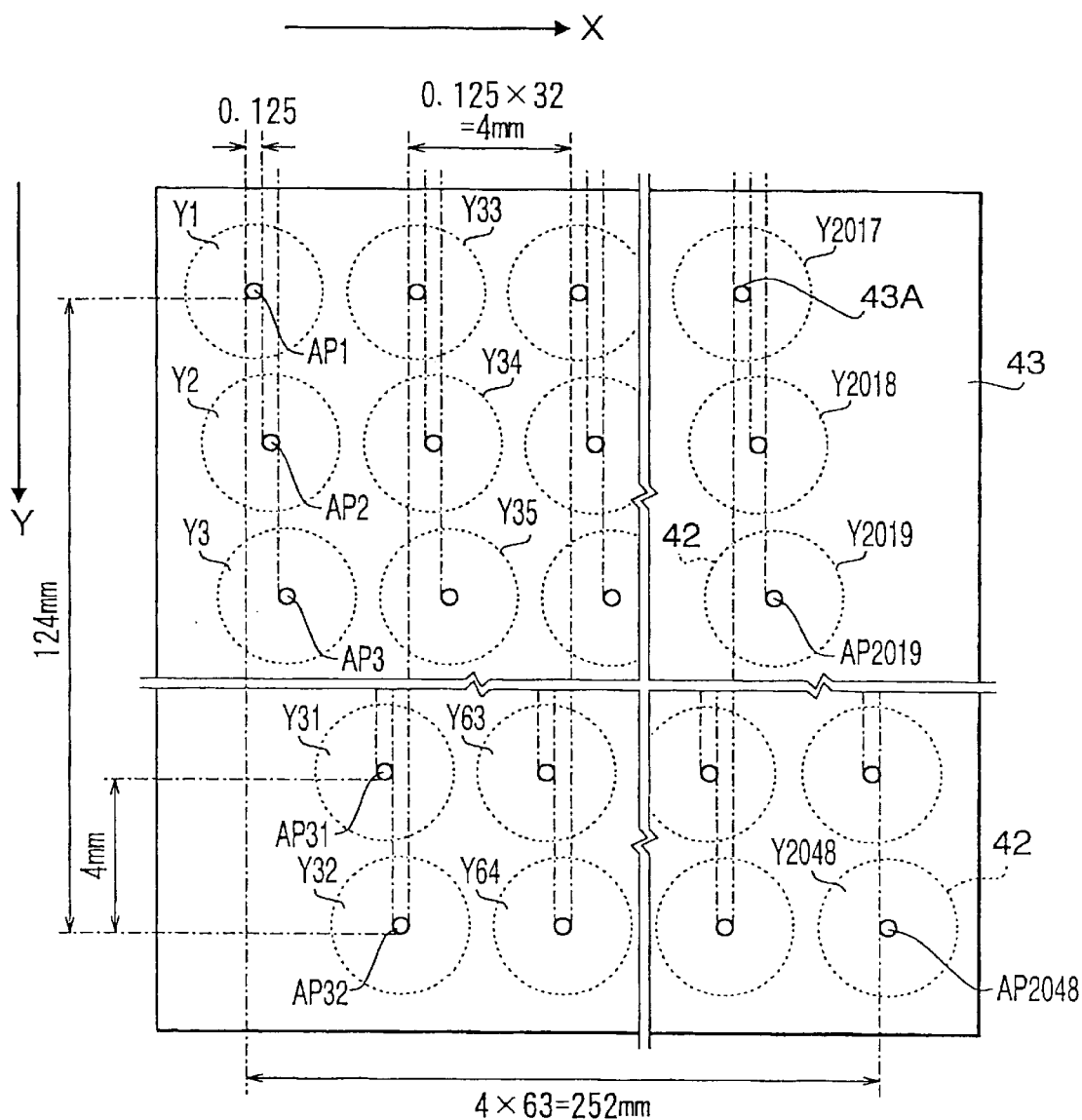
FIG. 3 is a top view of an aperture plate viewed from a light emitting unit side.

As shown in FIG. 3, the apertures 43A are of a diameter of 0.125 mm, and are arranged in evenly separated rows separated by a distance of 4 mm, hereinafter referred to as inter-row pitch. Within each row, the apertures 43A are evenly separated by an interval, hereinafter referred to as inter-column pitch of 4 mm. Each row is staggered from the previous row in the X direction by an amount corresponding to the diameter (i.e., 0.125 mm) of the apertures 43A, giving the angled column.

Accordingly, the right hand side tangential line in the Y direction of each aperture 43A is collinear with the left hand side tangential line in the Y direction of the aperture 43A in the following row. Similarly, since the inter-column pitch is determined based upon the aperture diameter and the number of rows, the right hand side tangential line in the Y direction of each aperture 43A in the last row is collinear with the left hand side tangential line in the Y direction of the aperture 43A in the following angled column of the first row, 31 rows above.

The locations of the LED's 42 are labeled $Y_n$, n being from 1 to 2048, from the first row and first angled column, along the columns from top to bottom. That is, in this example having 32 rows and 64 angled columns, the LED's 42 in the first angled column are labeled by $Y_1, Y_2, Y_3 \ldots Y_{32}$, those in the second angled column are labeled by $Y_{33}, Y_{34}, Y_{35} \ldots Y_{64}$, and continuing on to the 32nd and last angled column, labeled by $Y_{2017}, Y_{2018}, Y_{2019} \ldots Y_{2048}$. As noted, in each row, the columnar location of the LED's 42 are shifted in the X direction from the LED's 42 of the previous row by diameter D of the apertures 43A.

Similarly to the LED's 42, the locations of the apertures 43A are labeled as $AP_n$, n being from 1 to 2048, from the first row and first angled column, along the columns from top to bottom. That is, in this example having 32 rows and 64 angled columns, the apertures 43A in the first angled column are labeled by $AP_1, AP_2, AP_3 \ldots AP_{32}$, those in the second angled column are labeled by $AP_{33}, AP_{34}, AP_{35} \ldots AP_{64}$, and continuing on to the 32nd and last column, labeled by $\ldots AP_{2047}, AP_{2048}$. As noted, in each row, the columnar location of the apertures 43A are shifted in the X direction from the apertures 43A of the previous row by the diameter (i.e., 0.125 mm) of the apertures 43A.

FIG. 4 shows a schematic pattern of the dot images of the apertures 43A formed on the photosensitive film 3 when all of the LED's 42 emit a light beam. When the LED's 42 are selectively controlled to be ON or OFF, the pattern is formed from dot images (ON) and spaces (OFF). As mentioned above, the reducing optical system forms a 1/25 time reduced image of the aperture plate 43 on the film 3, and the size of the formed image on the film 3 is 10.235 mm in the X direction, and 4.96 mm in the Y direction as shown in FIG. 4.

Practically, it is preferable to adjust the level, in the direction of the optical axis, of the image plane. That is, for example, if a substrate is placed instead of the photosensitive film 3, the image plane should be changed. In other words, a focusing should be performed to adjust the level of the image plane. A structure for focusing in such a situation is described, for example, in the U.S. patent application Ser. No. 08/648,767, filed on May 16, 1996, entitled "Multibeam Recording Device", teachings of which are incorporated herein by reference.

In the description hereinafter, for simplification purpose, it is assumed that the image plane coincides with the surface of the film 3.

Figure 5:
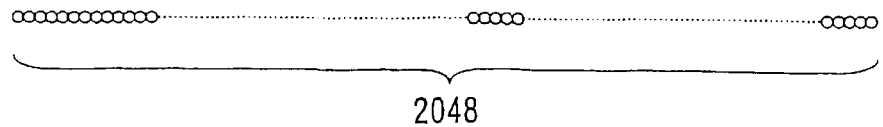
FIG. 5 shows a line image formed as an array of 2048 dot images.

The light emission of the LED's 42 in the array and the movement of the table 2 are synchronized to be able to form 2048 dot images in a continuous line, the pattern of dot images at locations within the line depending on which LED's 42 are ON or OFF. The dot image locations along the line have a pitch equal to the dot image diameter (i.e., all dot image locations in the line tangential to the next), as shown in FIG. 5. The dot image diameter is determined by the magnification of the imaging optical system and the aperture diameter (i.e., 0.125 mm).

To form a continuous line, light beams from the LED's 42 in the first row of LED locations (in this example, $Y_1$, $Y_{33}$, $Y_{65}$... $Y_{2017}$) separated by the aforementioned inter-column pitch form discrete dot images (when ON) at locations aligned in a line L1 on the film 3. This line L1 is depicted in FIG. 4. Subsequently, the table 2 transfers the film 3 in the Y direction by an amount determined by the inter-row pitch and the magnification of the imaging optical system, so that the dot image formed by the light from the LED's 42 (when ON) in the second row of LED locations will coincide with the line L1.

For example, when the reducing magnification of the imaging optical system is 25:1, the diameter of each dot image is $\frac{1}{25}$ of the diameter of the apertures 43A, and the table must be transferred in the Y direction by $\frac{1}{25}$ of the inter-row pitch. After this movement, since the second row of apertures 43A, having the same inter-column pitch as the first row, is displaced from the first row of apertures 43A in the X direction by an amount of the aperture diameter, the light beams from the LED's 42 in the second row form discrete dot images adjacent and tangential to the dot image locations of the dot images previously formed by the LED's 42 in the first row. This procedure is repeated for all the rows.

As noted, since the inter-column pitch is determined by the aperture diameter and the number of rows, LED's 42 in the last row that are ON form discrete dot images that are adjacent and tangential on one side (in the X direction) to the previous row of dot image locations, and adjacent and tangential on the opposite side to the first row of dot image locations. Accordingly, when the table 2 and the LED's 42 of each of the rows are controlled until the LED's 42 of the last row are driven, a line image is formed as a collection of all the dot images of LED's that are ON (in this case, the selectively controlled dot images at 2048 adjacent locations), as shown in FIG. 5.

It should be noted that at the same time as the second row of LED's 42 is forming the second set of dot images of the line image for the first line L1, the first row of LED's can form the first set of dot images of a line image for a second line adjacent to the first. In this case, subsequently, the third row forms the third set of dot images for the first line L1, the second row forms the second set of dot images for the second line, and the first row forms the first set of row images for a third line adjacent to the second line, and so on.

As the table is driven in a pass along the Y direction and the line images are formed in this manner, a rectangular pattern portion is formed from the successive lines, the rectangular pattern portion being as wide as the lines (in this case, 124 mm and 2048 dot images wide). When the light emitting unit 4 completes a pass scanning from one terminus to the opposite terminus of a pattern on the film 3 as the table moves along the Y direction, the first pass is complete, the first rectangular pattern portion of the complete pattern is formed, and the table is stopped. The optical system transport stage 5S is moved in the x direction by the width of one rectangular pattern portion (in the given example, by 124 mm). Then, the table 2 is started to move in the reverse direction along the Y direction for a second pass.

In reverse, the LED's 42 are controlled such that the last row of LED's forms the first set of dot images of the first line image in the reverse direction, followed by the second-last row, and so on. Thus, a second rectangular pattern portion of the pattern is formed adjacent to the first in a second pass. When the second pass is complete, and the second rectangular pattern portion of the pattern is formed in the reverse direction, the optical system transport stage 5S is moved in the X direction by the width of the rectangular pattern portion again, and a subsequent pass for forming a subsequent (third) rectangular pattern portion is formed in the forward direction as previously described.

The process is repeated until a complete pattern is formed from the sequential passes, imaging the adjacent rectangular pattern portions in a row to form the complete pattern. The moving amount of the optical system transport stage 5S in the X direction between adjacent rectangular pattern portions is controlled so as not to produce overlap or space between the adjacent rectangular pattern portions, and to form a complete pattern made of the sequential rectangular pattern portions.

Figure 6:
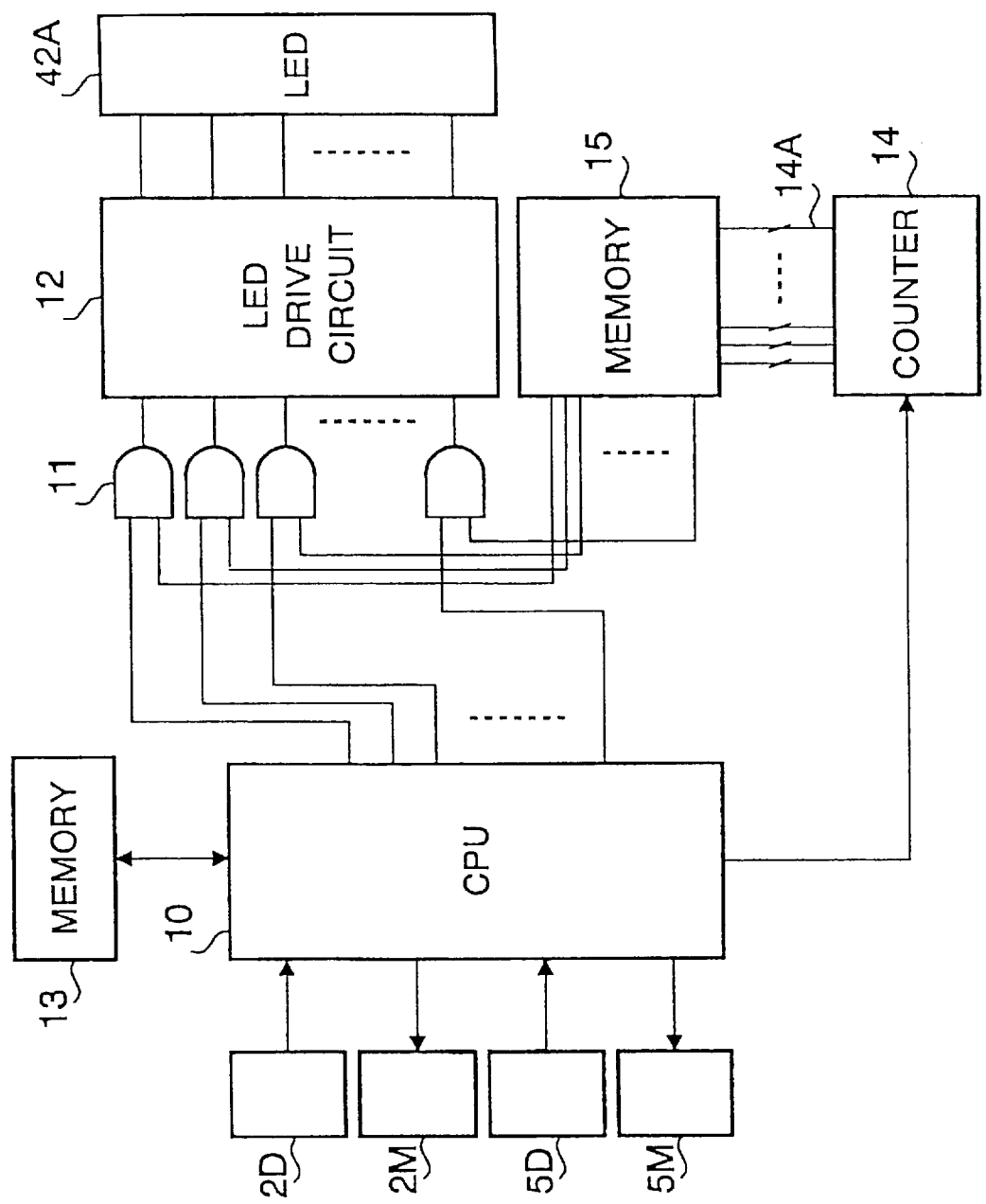
FIG. 6 is a block diagram of a control system of the image forming apparatus of FIG. 1.

FIG. 6 is a block diagram of the controlling system of the image forming apparatus 100. Image data is stored in a first memory 13 as a bit map data. A CPU (Central Processing Unit) 10 transmits driving signals to AND gates 11 which respectively correspond to the LED's of the LED array 42A, i.e., 2048 AND gates 11 are provided. A counter 14 decrements or increments an address which is transmitted through an address bus 14A to designate an output port of a second memory 15 and data to output. Accordingly, to the AND gates 11, a driving pattern data which is also stored in the memory 15 is applied.

The driving pattern data is data representative of pulse patterns for driving the LED's. The amount of light emitted from each LED 42 is controlled in accordance with the width and the number of pulses included in the pattern data. Output of the AND gates 11 are transmitted to the LED driving circuit 12. The LED driving circuit 12 applies pulse-like electrical current having a predetermined amplitude to each LED 42 in accordance with the signal transmitted from the AND gates 11.

In the multi-beam image forming apparatus 100, the CPU 10 firstly drives the optical system driving motor 5M to adjust the position of the light emitting unit 4 in the X direction. Then the CPU 10 drives the motor 2M to move the table 2 in the Y direction, and drives the LED array 42A to emit beams. As described before, when the motors 5M and 2M are driven, output of the scale detection heads 5D and 2D are fed back to the CPU 10, and the table 2 is accurately positioned.

FIG. 7 is a partial top view of the table 2 and film 3 around the original point IO. In FIG. 7, an image forming area on the film 3 is, on the right-hand side of the original point IO in the X direction, and on upper side of the original point IO in the Y direction. The edges of the film 3 are located outside the original point IO, as shown in FIG. 7.

The optical axis of the light emitting unit 4 can be located on the lower left-hand side of the original point IO in FIG. 7. In FIG. 7, an initial position IP of the optical axis of the light emitting unit 4 when an image forming operation is to be started is indicated. Due to a structure of the optical system driving mechanism, the optical axis of the light emitting unit 4 cannot be moved to the left-hand side of the initial position IP in FIG. 7. As for the Y direction, by moving the table 2 upward direction in FIG. 7, the optical axis of the light emitting unit 4 can be moved to a lower position in FIG. 7.

Figure 8:
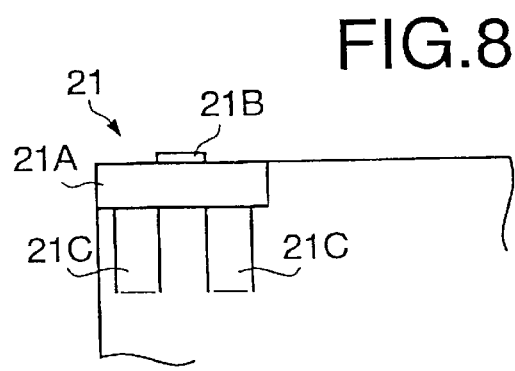
FIG. 8 shows a portion around a light amount detection unit on a table on which a photosensitive film is placed.

On a side surface of the table 2, a light amount detector 21 is provided. As shown in FIG. 7, the light amount detector 21 is extended in the Y direction. In FIG. 7, a top view of the light amount detector 21 is shown, and FIG. 8 shows a front view thereof. The light amount detector 21 is constructed such that a photodiode 21B is provided at an central part of a base plate 21A. The base plate 21A is supported by a pair of pillars 21C and 21C fixed on the side surface of the table 2, as shown in FIG. 8. The photodiode 21B is positioned such that the light receiving surface of the photodiode 21B and the surface of the photosensitive film 3 are substantially on a same plane. In the embodiment, the photodiode 21B is a so-called can type photodiode which has the light receiving element and a cylindrical casing surrounding the light receiving element. The diameter of the casing is approximately 5 mm, and the diameter of the light receiving element is approximately 3 mm.

In this embodiment, the light amount of each LED 42 is detected with use of the photodiode 21B, and based on the result of the detected light amount, compensation is made when each LED 42 is driven to emit a light beam. As described before, the size of the aperture image is 10.235 mm×4.96 mm which is greater than the light receiving surface of the light receiving element of the photodiode 21B. Accordingly, in the embodiment, the LED's 42A are divided into a plurality of groups (i.e., the light emitting area is divided in to a plurality of segment), and the table 2 and the light emitting unit 4 are moved to receive the light beams emitted by the LED's of each of the plurality of groups.

Figure 9:
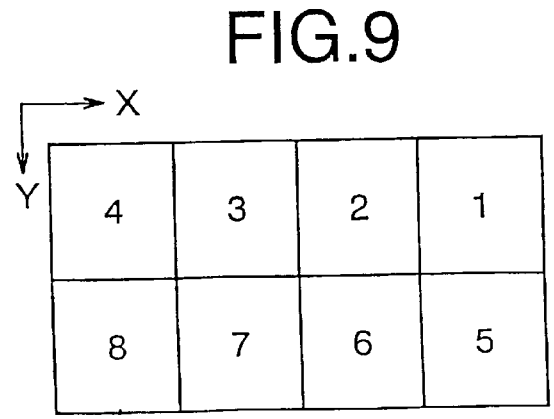
FIG. 9 shows segments which are referred to when a light amount of the LED's are detected.

FIG. 9 shows eight segments of the imaging area shown in FIG. 4. The imaging area is divided into four in the X direction, and divided into two in the Y direction. In each segment (numbered as 1–8), 256 dot images are included. It should be noted that the segments are not a physically divided ones, and are defined for describing purpose. It is possible to form dot images only in one segment by driving the LED's corresponding to the segment which is referred to.

Measurement of the light amount of the LED's corresponding to each segment is executed as described below.

Firstly, by driving the motors 5M and 2M, the light emitting unit 4 and the table 2 are moved so that the optical axis of the photodiode 21B coincides with the center of the segment 1. It should be noted that the positioning of the table 2 and the light emitting unit 4 can be performed easily since the initial position IP and the center of the photodiode 21B are known. Further, the size of each segment 1–8 is smaller than the light receiving surface of the photodiode 21B so that all the beams corresponding to one segment can be received by the photodiode 21B without moving the table 2 and light emitting unit 4.

When the center of the segment 1 coincides with the center of the light receiving surface of the photodiode 21B, the LED's 42A corresponding to the segment 1 are driven to emit sequentially (time-divided drive), and the electrical current available in the photodiode 21B when each LED 42A is driven is stored in the memory 13 as an eight-bit digital data. In other words, for each LED 42A corresponding to the segment 1, the amount of the emitted beam is detected and stored as a 256 steps (i.e., 0–255) of gradation data.

Next, by moving the light emitting unit 4 in the X direction by a predetermined amount (in this embodiment, 2.56 mm), the center of the segment 2 is positioned to coincide with the center of the light receiving surface of the photodiode 21B. Similarly to the above (operation with respect to the segment 1), the LED's 42A corresponding to the segment 2 are driven one by one, 256 steps of light amount data is obtained for each LED 42A, and stored in the memory 13. Similar operation is performed for the segments 3 and 4.

Then, the table 2 is moved in the Y direction by a predetermined amount (2.56 mm in this embodiment). Further, the light emitting unit 4 is moved to the position at which the unit 4 was located when the operation with respect to the segment 1 was executed. With this condition, the light amount of the LED's corresponding to the segment 5 can be obtained. Similarly to the operation for segments 1 through 4, the light amount of the LED's 42A for the segments 5 through 8 is obtained one by one, and stored in the memory 13.

How the obtained light amount data for each LED 42A is used will be described hereinafter.

Figure 10A:
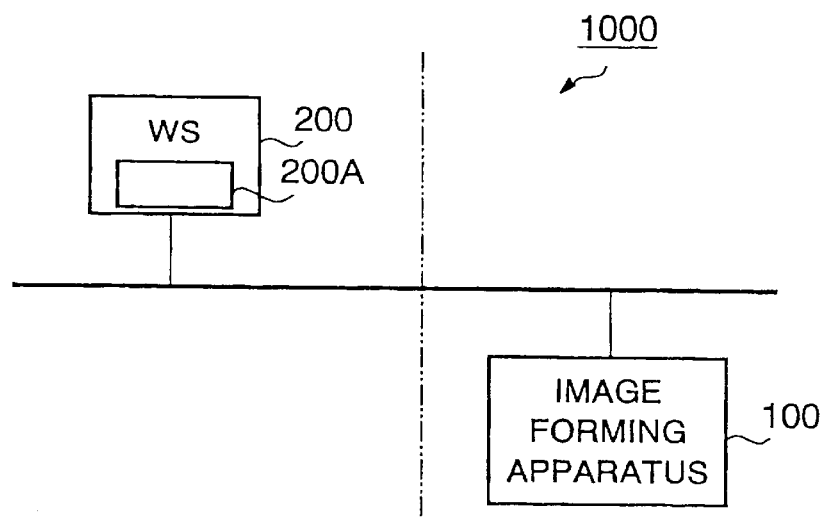
FIG. 10A shows an example of a configuration of a drawing system.
Figure 10B:
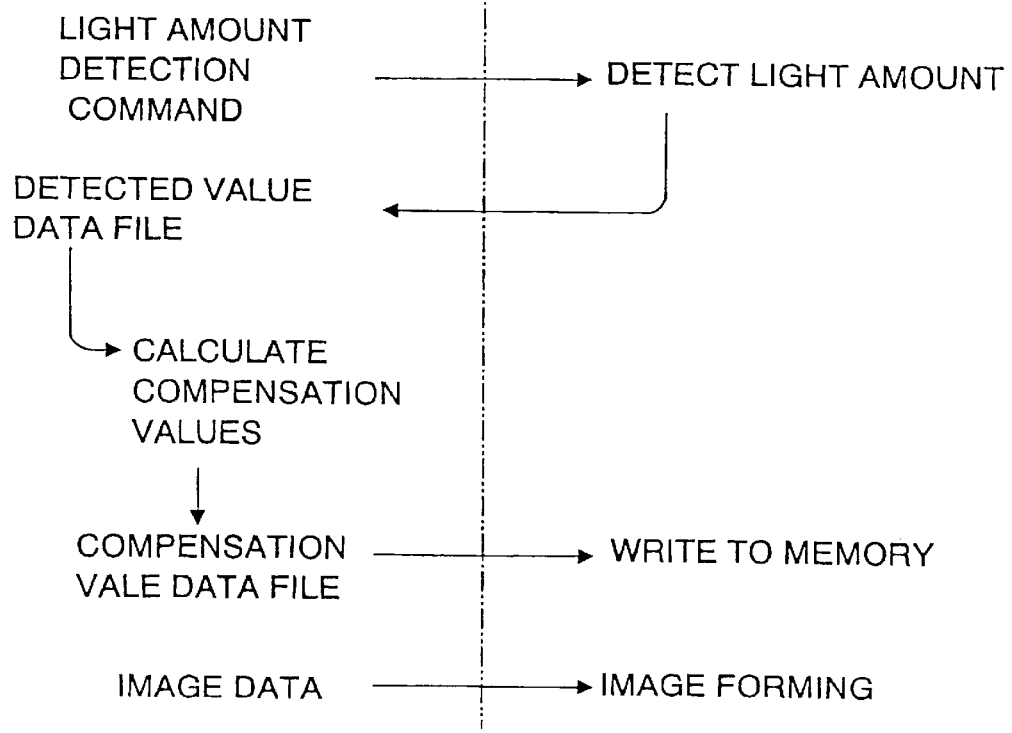
FIG. 10B is a chart illustrating operations executed in the system shown in FIG. 10A when the light amount is detected.

FIG. 10A shows a configuration of a drawing system (multi-beam image forming system) 1000 including the multi-beam image forming apparatus 100, and FIG. 10B is a chart illustrating the operation of the drawing system shown in FIG. 10A.

The drawing system 1000 includes at least one work station 200, and at least one image forming apparatus 100 which are interconnected through an Ethernet. The amount of light for each LED 42A is detected as described below.

Firstly, in the work station 200, a communication process is initiated, and then the work station 200 (i.e., a microprocessor 200A incorporated in the work station 200) sends a light amount detection command to the multi-beam image forming apparatus 100. The image forming apparatus 100 executes the above-described light amount detection process upon receipt of the light amount detection command from the work station 200. The multi-beam image forming apparatus 100 creates a detection data file after detecting the light amount of all the LED's 42A, and then transmits the detection data file to the work station 200.

The work station 200 executes a compensation value calculation process which will be described later based on the received light amount detection data file, and creates a light amount compensation data file which will be referred to when the LED's 42A are driven. The light amount compensation data file is sent to the image forming apparatus 100.

The multi-beam image forming apparatus 100 forms an image of a circuit on the image forming area of the photosensitive film 3 that is placed on the table 2 by driving the light emitting unit 4, motors 2M and 5M in accordance with the image data file and with reference to the light amount compensation data file.

FIG. 11 is a flowchart illustrating the light amount compensation process according to a first embodiment of the invention. This process is executed, for example, by the microprocessor 200A incorporated in the work station 200 (shown in FIG. 10A).

Firstly, the microprocessor 200A determines whether the detected value for each LED 42A in the detected value data file is 0 or 255 at S1. If value 0 or 255 is included, the microprocessor 200A determines that the image forming apparatus 100 is out of order (NG).

Value 0 means that the light amount is 0, i.e., the LED 42A corresponding to the value is not turned ON. Therefore, if the value is 0, it is determined that the corresponding LED 42A is broken. With the image forming device 100 having a broken LED 42A, it is impossible to form an image accurately, and accordingly, the microprocessor 200A determines that such an image forming apparatus is malfunctioned, or broken (i.e., NG) at S3.

Each LED 42A is controlled to emit light, the light amount value of which is sufficiently smaller than 255. If a detected light amount value of an LED 42A is 255, it is probable that the light amount is too strong, Also in this case, it can be considered that the image cannot be formed accurately by the image forming apparatus 100.

As described above, it is not preferable to use the image forming apparatus 100, which includes an LED 42A broken, or emits too strong light, and the microprocessor 200A detects the image forming apparatus is out of order.

If the determination at S3 is NG, an NG process (55) is executed and the light amount compensation process is terminated. In the NG process, for example, a message indicating the LED's 42A which may have a problem is output to a printer (not shown) or a display (not shown).

If the detection data does not include 0 or 255 (S3:OK), control proceeds to S7 at which a value corresponding to a dark current value of the photodiode 21B is subtracted from the light amount detection value of each LED 42A. That is, Ln'=Ln−Lo, where Ln' represents the detection value (n=1–2048), Ln represents the detected value, and Lo represents the detection value when the dark current is available in the photosensor 21B. That is, the value Ln' is a value which does not contain the component of the dark current, and represents the light amount emitted by each LED 42A. At this stage, if Ln' is equal to or less than 0, it is considered that the LED 42A does not emit light. Therefore, at S9, it is determined whether the detected values indicate that one of the LED's 42A is 0 or less. If one of the light amount value is 0 or less (S9:YES), control goes to the NG process which is described above. If Ln' is greater than 0 (S9:NO), control goes to S1.

In the embodiment, if the values Ln' (n=1–2048) is less than ten times of the minimum value Lmin among the values Ln' (n=1–2048), the light amount of the LED's can be compensated.

In S11, the minimum value among the detection values Ln' is detected. Then, based on a difference of a detection value Ln' with respect to the minimum value Lmin, a driving time interval of an LED 42A corresponding to the value Ln' is determined. Specifically, at S13, the period during which an LED 42A is driven is determined in accordance with the equation below:

$$Pn=(Lmin/Ln')\times 10$$

where, Pn is a time interval of an LED 42A corresponding to the detection value Ln' when the period during which the LED 42A corresponding to the minimum detection value is 10. Since Lmin is equal to or less than Lmin, Pn≦10 (Pn=10 when Lmin=Ln').

Next, at S15, it is determined whether the calculated period Pn is less than 1. If Ln≧10×Lmin, Pn<1 at step S15, and in this case, another NG process is executed, and an error message or the like is output to the display or the printer.

If Pn≧1, the difference of the light amount can be compensated (since 1≦Pn≦10), and the light amount compensation file which contains the values of Pn for each LED 42A is created (S19). The light amount compensation file thus created is transferred to the multi-beam image forming apparatus 100 through the ethernet and stored in the memory 13.

In the image forming apparatus 100, each LED 42A is driven in accordance with the image data and the data Pn included in the light amount compensation file. That is, the duration of time during which each LED 42A is driven to emit light is controlled in accordance with the period Pn, and accordingly the amount of light accumulated on the film 3 corresponding to respective LED's 42A can be made substantially the same.

It should be noted that in the present embodiment, the driving period of the LED 42A has ten steps (from 1 to ten times of a unit period), and can be changed stepwisely. Accordingly, the diving time period can be determined in accordance with the equation below:

$$\text{Drive Time Period}=[U.P.\times Pn]$$

where, U.P. is the unit of the driving time period, and the bracket (i.e., [ ]) means the integer part of the calculation result.

According to the above-described compensation, not only the individual difference of the LED's but also the characteristics of the optical system of the light emitting unit 4 can be taken into account when the compensation value data is determined. Therefore, compensation can be made accurately, and the quality of the image can be improved.

Although the process shown in FIG. 11 is executed by the microprocessor 200A of the work station 200, it may be possible that the CPU 10 of the light emitting unit 4 executes the similar process.

Figure 12:
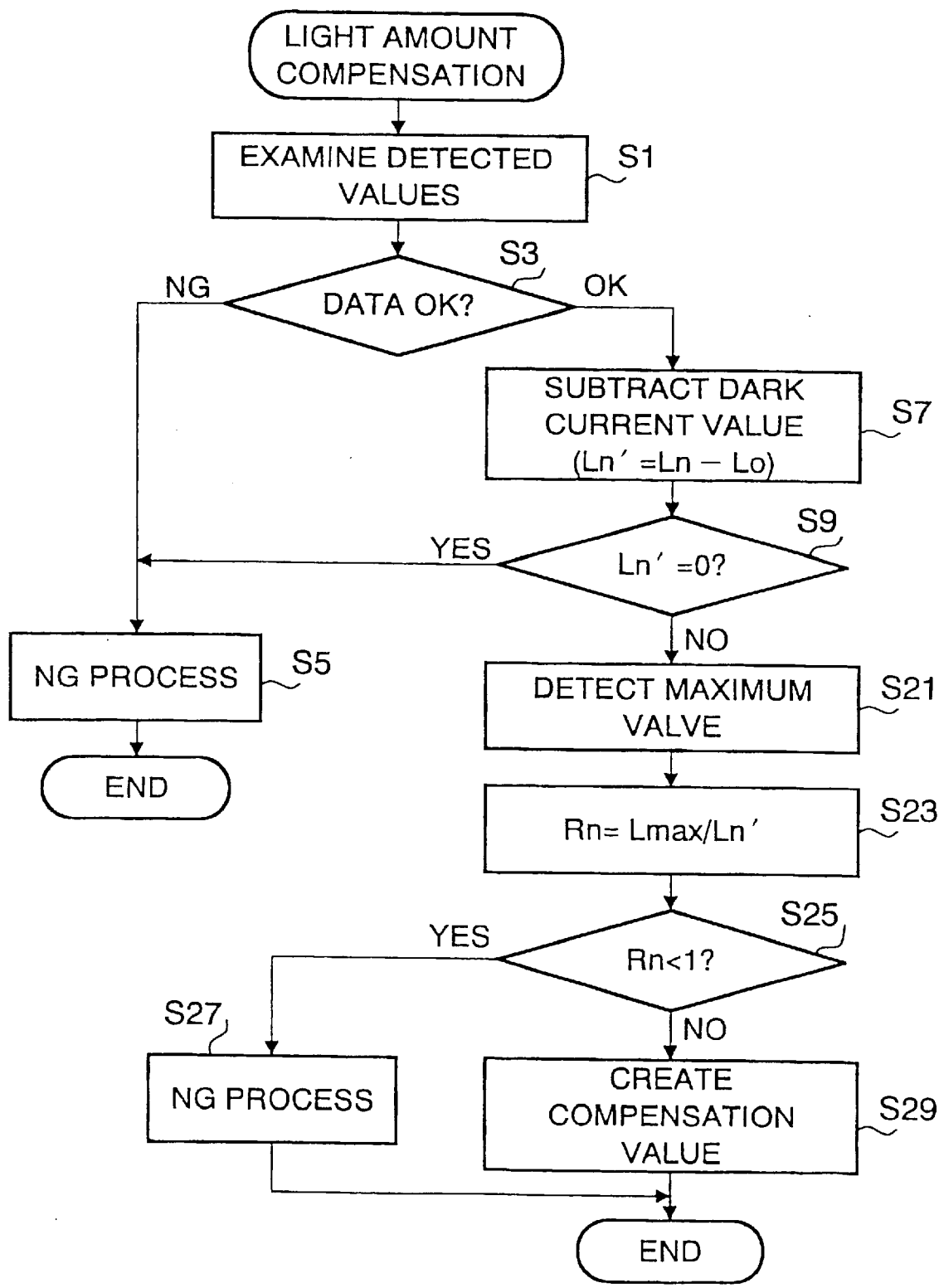
FIG. 12 is a flowchart illustrating a light amount compensation process according to a second embodiment.

FIG. 12 shows a flowchart illustrating the light amount compensation process according to a second embodiment. The process shown in FIG. 12 is also executed by the microprocessor 200A of the work station 200.

In FIG. 12, steps S1 through S9 are the same as in the steps shown in FIG. 11, and a description thereof will be omitted.

In S21, the maximum value Lmax among the detection values Ln' is detected. Then, based on a difference of a detection value Ln' with respect to the maximum value Lmax, a driving time interval of an LED 42A corresponding to the value Ln' is determined. Specifically, at S23, the period during which an LED 42A is driven is determined in accordance with the equation below:

$$Rn=Lmax/Ln'$$

where, Rn is a time interval of an LED 42A corresponding to the detection value Ln' when the period during which the LED 42A corresponding to the maximum detection value is 10. Since Ln' is equal to or less than Lmax, Rn≦1 (Rn=1 when Lmax=Ln').

Next, at S25, it is determined whether the calculated period Rn is greater than 10. If Ln≦Lmax/10, Rn>10 at step S25, and in this case, another NG process is executed, and an error message or the like is output to the display or the printer.

If Pn ≧10, the difference of the light amount can be compensated (since 1≦Rn≦10), and the light amount compensation file which contains the values of Rn for each LED 42A is created (S29). The light amount compensation file thus created is transferred to the multi-beam image forming apparatus 100 through the ethernet and stored in the memory 13.

In the image forming apparatus 100, each LED 42A is driven in accordance with the image data and the data Rn included in the light amount compensation file. That is, the duration of time during which each LED 42A is driven to emit light is controlled in accordance with the period Rn, and accordingly the amount of light accumulated on the film 3 corresponding to respective LED's 42A can be made substantially the same.

It should be noted that in the second embodiment, the driving period of the LED 42A has ten steps (from 1 to ten times of a unit of driving period), and can be changed stepwisely. Accordingly, the driving time period can be determined in accordance with the equation below:

$$\text{Drive Time Period} = [U.P. \times Rn]$$

where, U.P. is the unit of the driving time period, and the bracket (i.e., [ ]) means the integer part of the calculation result.

Also, in accordance with the second embodiment, the uneven distribution of the light amount due to the individual LEDs' characteristics and the characteristics of the optical system can be compensated, and an accurate imaging can be achieved.

Although it is not shown, it may be possible to evaluate the compensation data. By providing a CCD (Charge Coupled Device) or the like, having substantially the same structure as the photodiode 21B, on the table 2 to receive the light, and controlling the LED's and CCD to integrate the light emitted by each LED, whether the compensation is performed accurately or not can be examined.

FIGS. 13A–13G show a chart illustrating the relationship between the LED driving pulses, driving pattern, and loci formed on the film 3 corresponding to one dot image.

In FIGS. 13A–13G, a situation in which a resolution of the compensation per one dot is 10, as described in the embodiments.

In the image forming apparatus 100, by changing a driving pattern of the LED 42A, the light amount is changed. In a memory 15, patterns to be used for changing the light amount are stored.

FIG. 13A shows a driving signal output from the CPU 10 to the AND gate 11.

FIG. 13B is a driving pattern for the LED which emits the lowest light amount. When the pattern shown in FIG. 13B is selected, both the signals shown in FIGS. 13A and 13B are input to the AND gate, and accordingly, the LED is continuously driven to emit light while the signal shown in FIG. 13A is kept ON. In this case, the locus formed on the film 3 is as shown in FIG. 13C.

If the detected light amount for an LED is relatively great, and Pn or Rn is equal to 6, a pattern shown in FIG. 13D is selected. The pattern shown in FIG. 13D has six units of ON period, and four units of OFF period. In this case, the locus formed on the film 3 is as shown in FIG. 13E, which has 6/10 of exposed part and 4/10 of not-exposed part.

FIG. 13F shows another pattern when Fn or Rn is 6. In this example, the locus of which is shown in FIG. 13G, the light amount for one dot image is the same as in the example shown in FIG. 13E. However, the LED is driven intermittently, and accordingly, the starting and ending points of the one dot image coincide with those shown in FIG. 13C.

Generally, when Pn or Rn is closer to ten, whichever pattern shown in FIG. 13D or FIG. 13F is used, the quality of the formed image may not be deteriorated. However, when Pn or Rn is relatively small, it is preferable to use the pattern shown in FIG. 13F since the positional relationship of the staring and ending points can be maintained and the quality of the image may be maintained.

As described above, compensation of the light amount is achieved based on the value of Pn or Rn. Further, the driving pattern (e.g., as shown in FIGS. 13B, 13D, 13F) is stored in the memory 15. If the light amount of all of the LED's should be lowered due to the sensitivity of the photosensitive film 3, only by changing the unit of driving period, a desired effect can be achieved while maintaining the quality of the image.

As described above, according to the image forming apparatus according to the invention, light amount emitted by a plurality of LED's can be detected easily, and based on the detected light amount, compensation values when each LED is driven can be determined easily. Further, in accordance with the compensation value for each LED, light emission can be controlled accurately.

The present disclosure relates to subject matter contained in Japanese Patent Application No. HEI 08-151699, filed on May 23, 1996, which is expressly incorporated herein by reference in its entirety.

What is claimed is:

1. A multi-beam image forming system for forming an image on a photosensitive material in accordance with an image data, comprising:

a plurality of light sources that respectively emit a plurality of beams;

a table that supports said photosensitive material on which an image is formed by said plurality of beams;

a light source driver that individually drives said plurality of light sources;

a light source moving mechanism that moves said light source relative to said table in at least a first direction, said first direction being parallel to a surface of said table on which said photosensitive material is supported;

a table moving mechanism that moves said table, relative to said light source, in at least a second direction different from said first direction, said second direction being parallel to said surface of said table on which said photosensitive material is supported;

a light sensor associated with said table, said light sensor receiving light and outputting a signal corresponding to the received amount of light;

a memory; and a controller that controls said light source driver, said light source moving mechanism and said table moving mechanism, such that all of said plurality of light beams are incident upon said light sensor at different timings, said signal output by said light sensor for each of said plurality of light sources being stored in said memory.

2. The multi-beam image forming system according to claim 1, wherein said plurality of beams are incident within a predetermined area on said photosensitive material, a light receiving area of said light sensor being smaller than said predetermined area, wherein said predetermined area is divided into a plurality of segments, each of which can be included in said light receiving area, and wherein said controller controls said table moving mechanism and said light source moving mechanism so that one of said plurality of segments is included in a light receiving surface, and then controls said light source driver to drive said plurality of light sources such that said plurality of light sources corresponding to said plurality of segments included in said light receiving surface is driven to emit a beam one by one.

3. The multi-beam image forming system according to claim 2, wherein said controller does not drive said light source moving mechanism and said table moving mechanism when one said plurality of light sources corresponding to a segment of said plurality of segments included in said light receiving area is driven.

4. The multi-beam image forming system according to claim 3, wherein said controller drives said light source moving mechanism and said table moving mechanism when all said plurality of light sources corresponding to said segment included in said light receiving area of said light sensor have been driven, such that another one of said plurality of segments is included in said light receiving area of said light sensor.

5. The multi-beam image forming system according to claim 2, wherein said plurality of light sources comprise a plurality of light emitting diodes.

6. The multi-beam image forming system according to claim 5, said plurality of light sources comprise an aperture plate formed with a plurality of apertures corresponding to said plurality of light emitting diodes, said aperture plate being provided close to said plurality of light emitting diodes and between said plurality of light emitting diodes and said table, and wherein said image forming system further comprises a converging optical system provided between said aperture plate and said table, said aperture plate and said photosensitive material being positioned at optically conjugate positions with respect to said converging optical system.

7. The multi-beam image forming system according to claim 1, wherein said signal stored in said memory represents gradation data consisting of a plurality of bits.

8. The multi-beam image forming system according to claim 7, further comprising an evaluation system which evaluates said data stored in said memory.

9. The multi-beam image forming system according to claim 8, wherein said evaluation system evaluates said data after an effect of dark current is removed from said data.

10. The multi-beam image forming system according to claim 8, wherein said evaluation system evaluates that an image forming system is out of use if one of said plurality of gradation data indicates light is not incident.

11. The multi-beam image forming system according to claim 8, wherein said evaluation system evaluates that an image forming system is out of use if one of said plurality of gradation data has its highest value.

12. The multi-beam image forming system according to claim 7, wherein said system is further provided with a device which calculates compensation data based on said gradation data, said compensation data being used by said light source driver when said plurality of light sources are driven so that a light amount received by said photosensitive material accurately corresponds to said image data.

13. The multi-beam image forming system according to claim 12, wherein said device obtains a minimum value from said gradation data, and determines a period of time during which each of said plurality of light sources is to be driven based on said minimum value and said gradation data corresponding to each light source.

14. The multi-beam image forming system according to claim 12, wherein said device obtains a maximum value from said gradation data, and determines a period of time during which each of said plurality of light sources is to be driven based on said maximum value and said gradation data corresponding to each light source.

15. The multi beam image forming system according to claim 12, further comprising another memory that stores a plurality of patterns according to which said plurality of light sources are driven, one of said plurality of patterns being selected based on said compensation data.

16. An image forming system including a multi-beam image forming apparatus that forms an image on a photosensitive material in accordance with an image data, and a control station connected to said multi-beam image forming apparatus, said image forming apparatus comprising:

a plurality of light sources that respectively emit a plurality of beams;

a table that supports said photosensitive material on which an image is formed with said plurality of beams;

a light source driver that separately drives said plurality of light sources;

a light source moving mechanism that moves said light source relative to said table, at least in a first direction, said first direction being parallel to a surface of said table on which said photosensitive material is supported;

a table moving mechanism that moves said table relative to said light source, in at least a second direction different from said first direction, said second direction being parallel to said surface of said table on which said photosensitive material is supported;

a light sensor provided to said table, said light sensor receiving light and outputting a signal corresponding to a received amount of light;

a memory; and a controller that controls said light source driver, said light source moving mechanism and said table moving mechanism, such that all of said plurality of light beams are incident with said light sensor at different timings, said signal output by said light sensor for each of said plurality of light sources being stored in said memory, said control station comprising:

a data evaluating system that evaluates data stored in said memory to determine whether said data stored in said memory is valid.

17. The image forming system according to claim 16, wherein said control station further comprises a device that calculates compensation data based on said data stored in said memory.

* * * * *

UNITED STATES PATENT AND TRADEMARK OFFICE
CERTIFICATE OF CORRECTION

PATENT NO.   : 5,812,892
DATED        : September 22, 1998
INVENTOR(S)  : H. MIYOSHI et al.

It is certified that error appears in the above-identified patent and that said Letters Patent is hereby corrected as shown below:

At column 14, line 65 (claim 3, line 4) of the printed patent, after "one" insert ---of---.

Signed and Sealed this

Sixth Day of April, 1999

*Attest:*

Q. TODD DICKINSON

*Attesting Officer*     Acting Commissioner of Patents and Trademarks